(12) United States Patent
Aburaya et al.

(10) Patent No.: US 8,309,847 B2
(45) Date of Patent: Nov. 13, 2012

(54) DRAIN STRUCTURE OF ELECTRIC CONNECTION BOX

(75) Inventors: Kengo Aburaya, Tokyo (JP); Fumikazu Naimi, Tokyo (JP); Masami Takase, Tokyo (JP)

(73) Assignee: Furukawa Electric Co., Ltd, Tokyo (JP)

( * ) Notice: Subject to any disclaimer, the term of this patent is extended or adjusted under 35 U.S.C. 154(b) by 226 days.

(21) Appl. No.: 12/597,663

(22) PCT Filed: Apr. 25, 2008

(86) PCT No.: PCT/JP2008/058147
§ 371 (c)(1),
(2), (4) Date: Apr. 1, 2010

(87) PCT Pub. No.: WO2008/136447
PCT Pub. Date: Nov. 13, 2008

(65) Prior Publication Data
US 2010/0230128 A1    Sep. 16, 2010

(30) Foreign Application Priority Data
Apr. 27, 2007    (JP) .................................. 2007-120362

(51) Int. Cl.
*H02G 15/02*    (2006.01)
(52) U.S. Cl. ............................ 174/50; 439/535; 248/906
(58) Field of Classification Search ...................... 174/50, 174/17 R; 439/535; 248/906; 220/374
See application file for complete search history.

(56) References Cited

U.S. PATENT DOCUMENTS 5,159,155 A * 10/1992 Nishihara ........................ 174/50

FOREIGN PATENT DOCUMENTS

| JP | 3052807    | 4/1997 |
| JP | 11266516 A | 9/1999 |
| JP | 200195129 A | 4/2001 |
| JP | 200667709  | 3/2006 |

OTHER PUBLICATIONS

International Search Report for PCT Application Serial No. PCT/JP2008/058147, 2 pages.
Microfilm of the specification and drawings annexed to the request of Japanese Utility Model Application No. 19954/1987 (Laid-open No. 131519/1988) (Yazaki Corp.), Aug. 29, 1988.

* cited by examiner

*Primary Examiner* — Dhirubhai R Patel
(74) *Attorney, Agent, or Firm* — Turocy & Watson, LLP

(57) ABSTRACT

Drain structure of an electric connection box is provided that is capable of preventing penetration of water with simplicity. According to the drain structure of the electric connection box, since a pair of engaging leg portions of a waterproof lid is engaged in a peripheral part of a communication hole of the drain portion and a lid portion covers the upper part of the water discharging hole, the water that penetrates through to the inside of the electric connection box through the communication hole and water discharging hole of the drain portion can be dammed in use of lid portion of the waterproof lid and can be prevented from gushing into the electric connection box. As a result, since it is possible to prevent the terminal portion of a wire such as a wire harness or the like, which is arranged to run from moistening with the water, penetration of water can be surely prevented. Furthermore, since the waterproof lid is formed apart from the lower case or lower cover and is applicable to the conventional structure, the whole structure can be simple and gives freedom to design the electric connection box.

4 Claims, 7 Drawing Sheets

DRAIN STRUCTURE OF ELECTRIC CONNECTION BOX

CROSS-REFERENCE TO RELATED APPLICATIONS

This application is a US national stage filing of patent cooperation treaty (PCT) Appln. No. PCT/JP2008/058147 (WO 2008/136447), filed Apr. 25, 2008, which claims priority to Japanese patent application No. 2007-120362, filed on Apr. 27, 2007, the entire content of which are incorporated herein by reference.

TECHNICAL FIELD

The present invention relates to a drain structure of an electric connection box mounted on an automobile or the like, in particular, the present invention relates to a drain structure of an electric connection box for draining off water which is captured inside the electric connection box and in addition, for preventing water from penetrating from outside thereof.

BACKGROUND ART

In general, in a vehicle such as an automobile or the like, the electric connection box such as a junction box, a fuse box, a relays-box or the like has been used for receiving electric parts such as wire harness connecting parts, a fuse, relays, an electronic control unit, or the like.

Since the electric connection box is mostly located in an engine compartment or a lower side part of a vehicle body, in such cases that it heavily rains, the vehicle body is washed by the water under the high pressure, and the practical test such as a pool diving test is executed, the water can penetrates through to the inside of the electric connection box. Furthermore, there can be dew condensation and collection of water drops inside the electric connection box. In such cases that the water penetrates through or collects inside the electric connection box, there are risks that such parts as circuit are short-circuited and that electrical current leaks, and, accordingly, the above described water may causes malfunction of the operation and melting to damage the parts.

Therefore, when the electric connection box has a lower case or lower cover, there is applied the structure in which a water discharging hole is formed on the bottom wall of the lower cover for draining off water which is inside the electric connection box to the outside through the water discharging hole in order to prevent water from collecting inside the electric connection box and to prevent water from penetrating through from the outside.

FIG. 3 is cross sectional view for explaining one example of the conventional drain structure of the electric connection box.

As shown in FIG. 3, the conventional drain structure of the electric connection box K2 includes the hollow drain portion 52 which is continuous with the water discharging hole 51 formed on the bottom wall 50 of the lower case or lower cover of the electric connection box.

The bottom wall 50 of the electric connection box is formed to downwardly incline toward the water discharging hole 51.

The drain portion 52 has an upper surface 52a and a bottom surface 52b. A communication hole 52c which is continuous with lower part of the water discharging hole 51 is formed on the upper surface 52a. A through hole 52d for passing through the water which penetrates from the outside is formed in one edge part of the upper surface 52a and bottom surface 52b. A drain port 52e for draining off the water which penetrates from the outside and which penetrates through the water discharging hole 51 to the outside is formed in another edge part of the upper surface 52a and bottom surface 52b.

The drain port 52e has vertical width greater than the through hole 52d. The bottom wall 52b of the drain portion 52 is formed to incline downward from the through hole 52d toward the drain port 52e.

In the conventional drain structure of electric connection box K2, the water penetrating through to the inside of the electric connection box drops on the bottom wall 50, collects on the water discharging hole 51 along the inclination, passes through the communication hole 52c of the drain portion 52, and is drained off from the drain port 52e to the outside (arrow M1).

On the other hand, since the water which upwardly penetrates from the outside is dammed by the outer wall of the drain portion 52, it is possible to prevent the water from penetrating through to the inside of the electric connection box (arrow M2).

The water which penetrates from the outside through the through hole 52d is drained off along the bottom surface 52b of the drain portion 52 and through the drain port 52e to the outside (arrow M3).

Furthermore, the water which penetrates through the drain port 52e is brought back along the bottom surface 52b of the drain portion 52 and drained off through the drain port 52e to the outside (arrow M4) (hereinafter, this art is referred to as prior art 1).

And in Patent document 1, there is proposed the drain structure of the electric connection box including a substantially funnel-shaped portion which is provided on a bottom wall of the electric connection box and whose base edge part is narrowed as going downward, a drain port including a cylindrical portion whose edge portion continuous with the substantially funnel-shaped portion has the same inner shape as the inner shape of a lowermost edge portion of the substantially funnel-shaped portion, and a reflecting member provided in the substantially funnel-shaped portion of the drain port, wherein the reflecting member includes a mortar-shaped recess portion which has a hole opening downward and is widen as going downward and a fixed flange portion which is fixed on the substantially funnel-shaped portion, and wherein a discharging portion through which moister inside the electric connection box can be discharged to the outside of the electric connection box, is provided on the fixed flange portion (hereinafter, this art is referred to as prior art 2).

Furthermore, in Patent document 2, there is proposed the drain structure of the electric connection box in which a drain port wall is provided to be projected from a case bottom wall of the electric connection box and a pair of waterproof lid engaging portions is provided to be faced each other and to be projected from the lower edge of the drain port wall, an engaging hook is inwardly provided to be projected from the lower edge of the waterproof engaging portion, the waterproof lid is mounted with the both edges held by the engaging hooks, and the waterproof lid is lifted up by water pressure from below and seals an opening of the lower edge of the drain port wall (hereinafter, this art is referred to as prior art 3).

Patent document 1: Japanese Patent Application Publication No. 2006-67709

Patent document 2: Japanese Patent Publication No. 3052807

DISCLOSURE OF INVENTION

Problem to be Solved

In the prior art 1, when large quantity of water penetrates from the outside through the through hole 52d or the drain port 52e (arrow M3, M4), or force of water is considerably strong, the water splashes into the electric connection box (arrow W5) and gushes inside the electric connection box. As a result, since the terminal portion T of the wire harness W or the like which is arranged to run has been moistened with the water, the insulation defect or the corrosion has been caused. After all, there has been a problem that the penetration of water cannot be fully prevented.

Furthermore, since the structure is required in which the drain port is bent-cranked in order to prevent penetration of water, there has been a problem that the structure of the mold becomes complex so that the manufacture thereof is difficult.

In the prior art 2, since a bump portion needs to be formed in the drain port to install the reflecting member, there has been a problem that the structure becomes complex.

In the prior art 3, since the drain port wall needs to be formed to movably support the waterproof lid, there has been a problem that the structure becomes complex.

The present invention is proposed for solving these problems described above, and one of the purpose of the present invention is to provide the drain structure of the electric connection box which is capable of fully preventing penetration of water with simple structure.

Means to Solve the Problem

The drain structure of electrical connection box of the present invention including a hollow drain portion in which a communication hole continuous with a water discharging hole of the electric connection box and the drain port for draining off water which penetrates from the communication hole to the outside, comprising; a waterproof lid including a substantially board-shaped lid portion and a pair of engaging leg portions provided in lower part of said lid portion: wherein said pair of engaging leg portions of said waterproof lid is engaged in peripheral part of said communication hole of said drain portion, and said lid portion is provided to cover said water discharging hole.

Said pair of engaging leg portions can be provided to be extended from the position inner than peripheral part of said lid portion in the substantially vertical direction.

Said pair of engaging leg portions can be formed to be widen in the substantially horizontal direction.

Effect of the Invention

According to the claim 1, since the pair of engaging leg portions of the waterproof lid is engaged in the peripheral part of the communication hole of the water discharging hole and the lid portion is attached to cover the upper part of the discharging port, it is possible to dam the water which penetrates through to the inside of the electric connection box through the communication hole and the water discharging hole of the drain portion with the lid portion of the waterproof lid, and to prevent the water from gushing inside the electric connection box. As a result, since it is possible to prevent terminal portion T of wire W such as wire harness or the like which is arranged to run from moistening with the water, penetration of water can be fully prevented.

And, since the waterproof lid is formed apart from the lower case or lower cover and can be applied to the conventional structure, the whole structure can be simple and gives freedom to design of the electric connection box.

According to the invention in claim 2, since the upper surface of the lid portion is formed to downwardly incline toward the outside, the water can easily flow toward the outside without collecting on the upper surface of the lid portion, and can be easily drained off to the outside along the bottom wall of the lower case or lower cover, the water discharging hole, the communication hole of the drain portion, and the drain port. Further, the contact area with the wire such as wire harness or the like which is arranged to run inside the electric connection box can be enlarged and the stress to the wire harness accompanied with vibration of the vehicle body or the like can be eased, and accordingly it is possible to prevent the wire from breaking.

According to the invention in claim 3, it is possible to prevent the wire from touching and winding around the engaging leg portions.

According to the invention in claim 3, it is possible to prevent and surely dam the water which penetrates through to the electric connection box with the wide engaging leg portions.

EXPLANATION OF REFERENCE NUMERALS

Figure 1A:
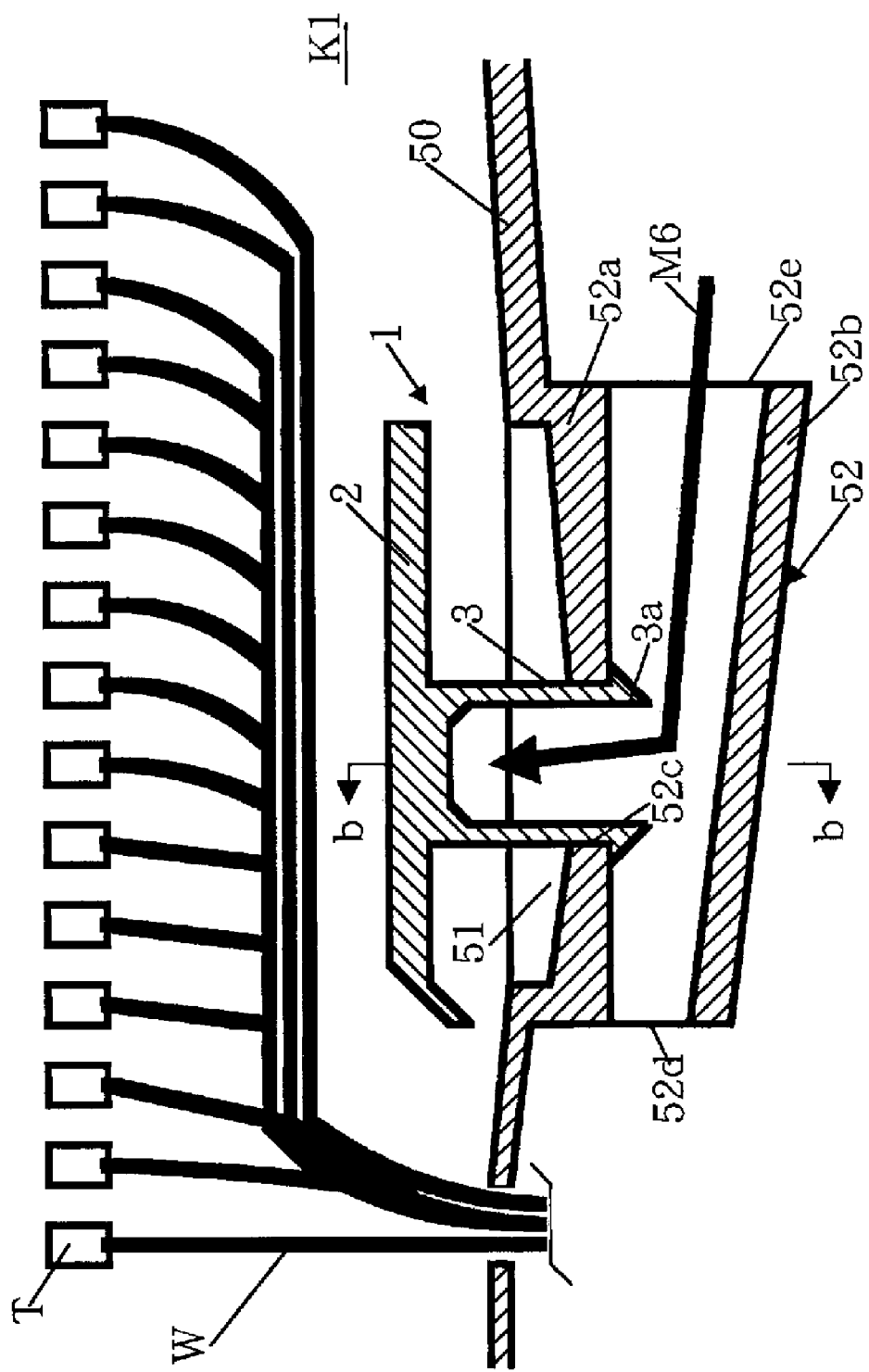
FIG. 1 (A) is sectional view of the drain structure of electric connection box according to the embodiment of the present invention, and (B) is sectional view of (A) taken along the line b-b.

K1 . . . drain structure of electrical connection box
W . . . wire
1 . . . waterproof lid
2 . . . lid portion
3 . . . engaging leg portion
3a . . . engaging hook
50 . . . bottom wall
51 . . . water discharging hole
52 . . . drain portion

DESCRIPTION OF THE PREFERRED EMBODIMENT

Figure 1B:
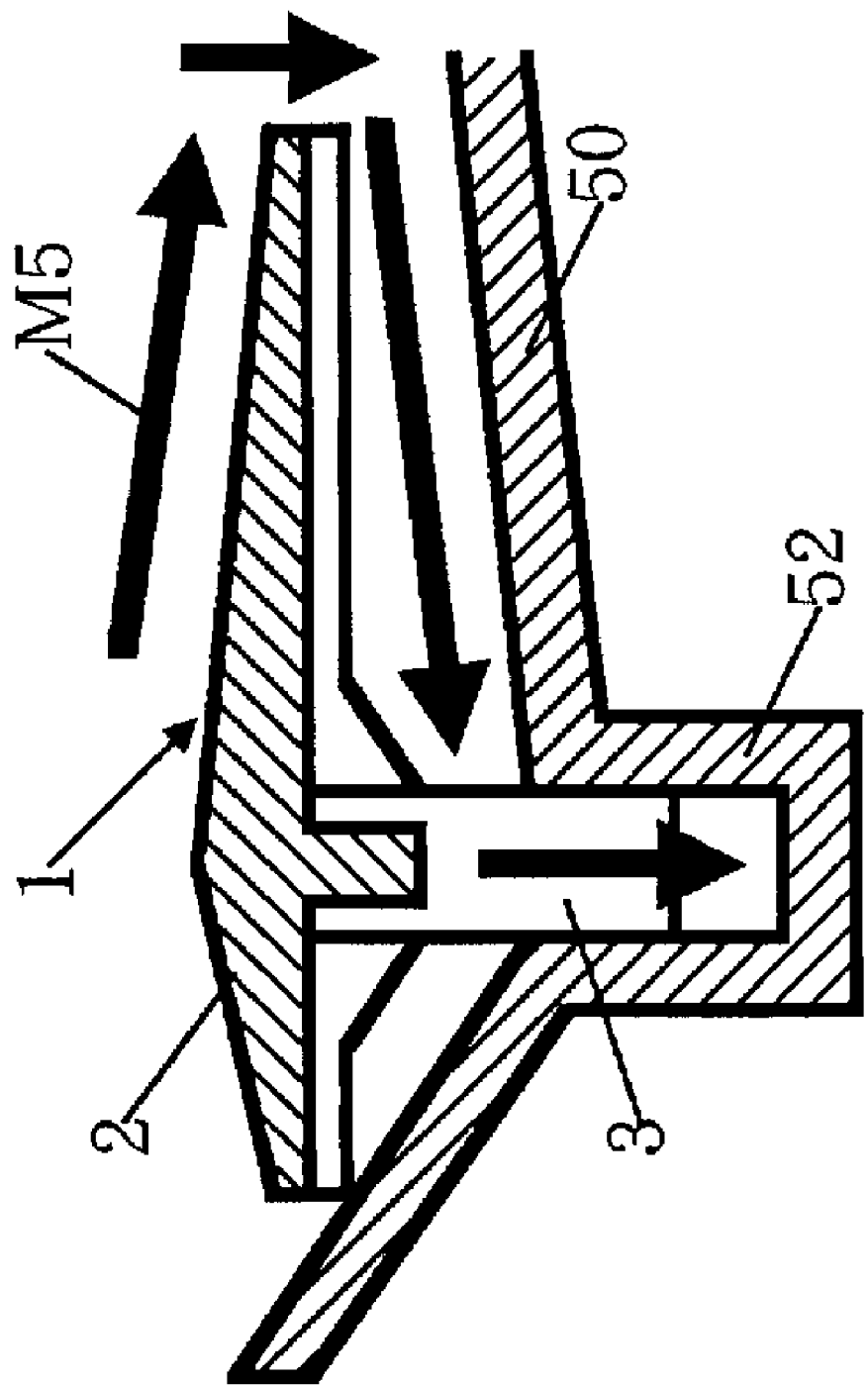
Figure 2A:
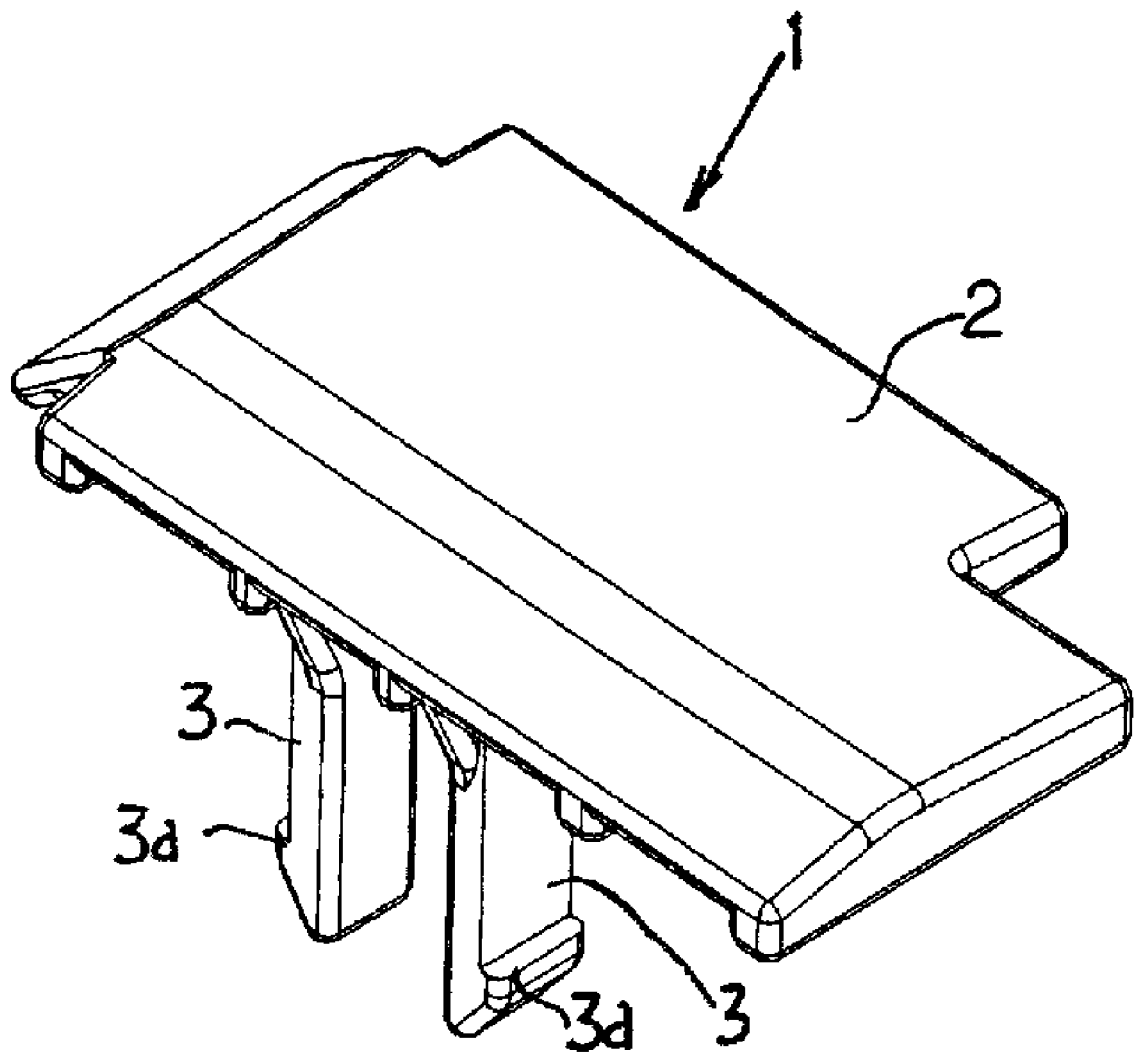
FIG. 2 (A) is perspective view of the waterproof lid seen from above, (B) is perspective view of the waterproof lid seen from below, (C) is front view of the waterproof lid, (D) is side view of the waterproof lid.
Figure 2B:
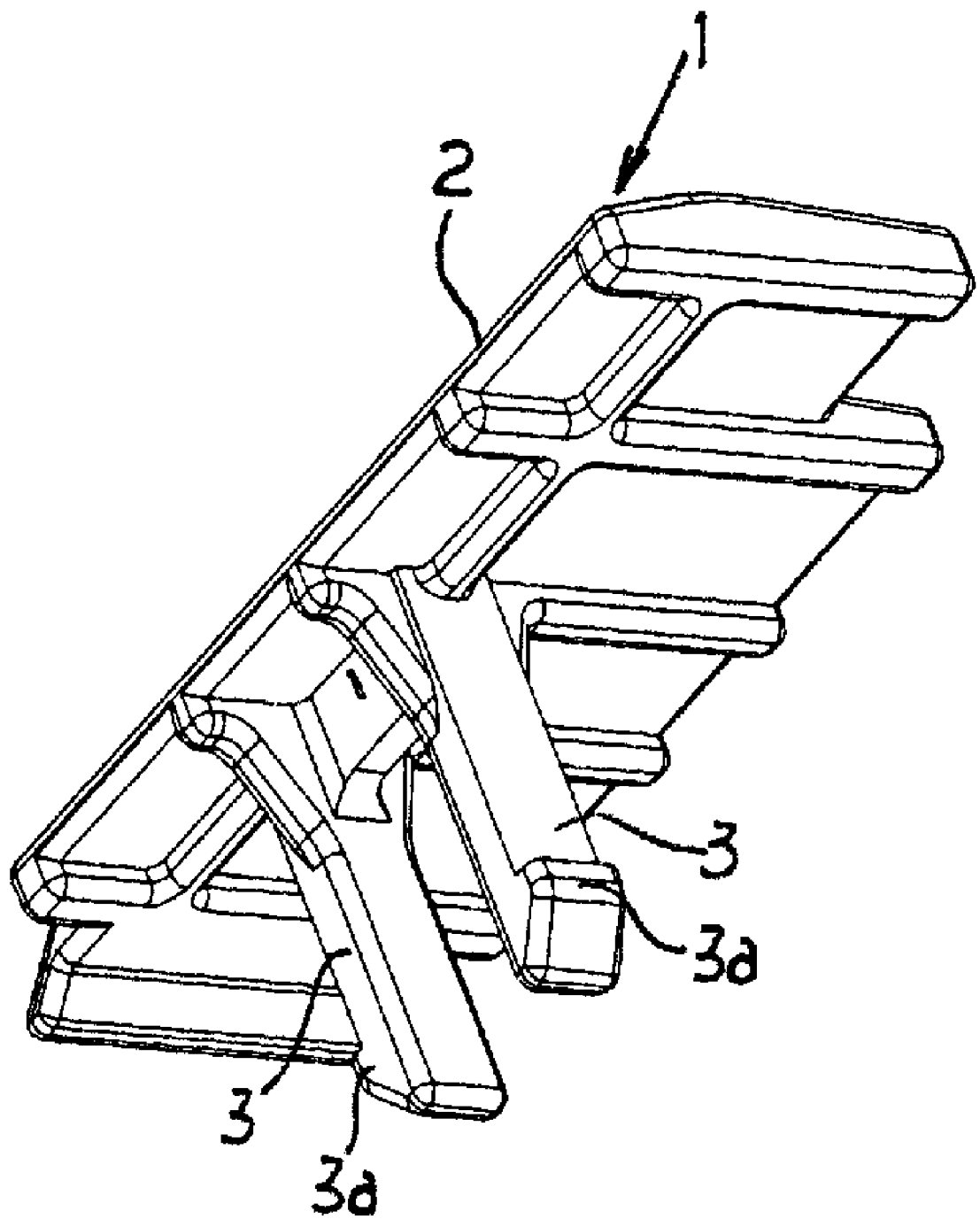
Figure 2C:
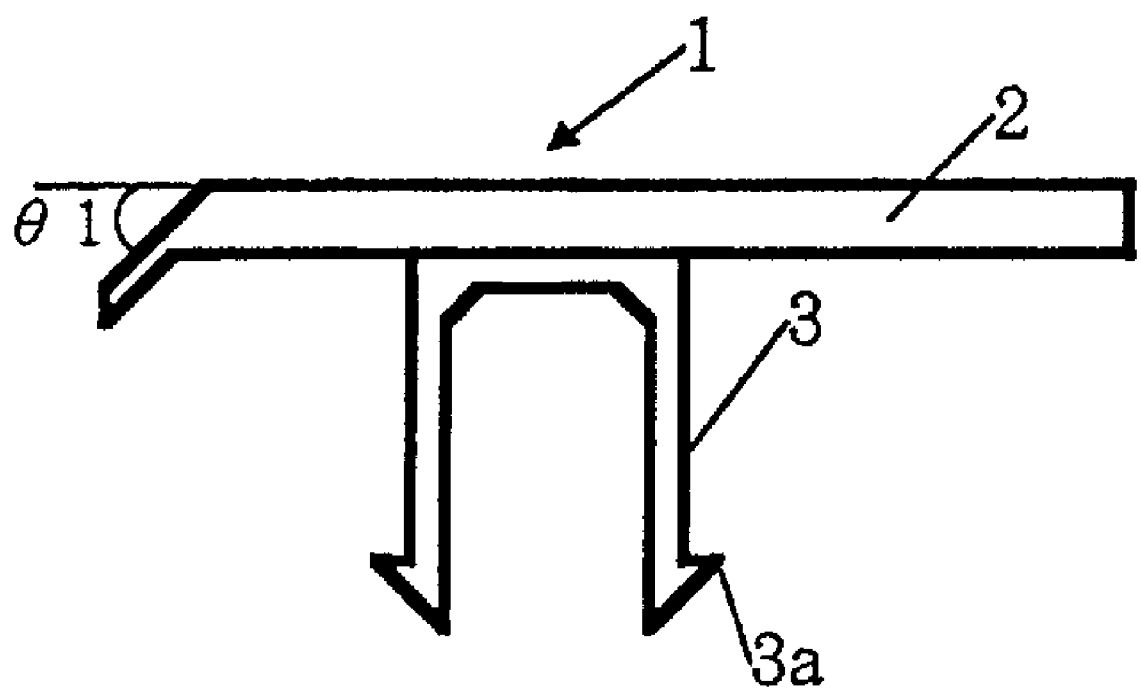
Figure 2D:
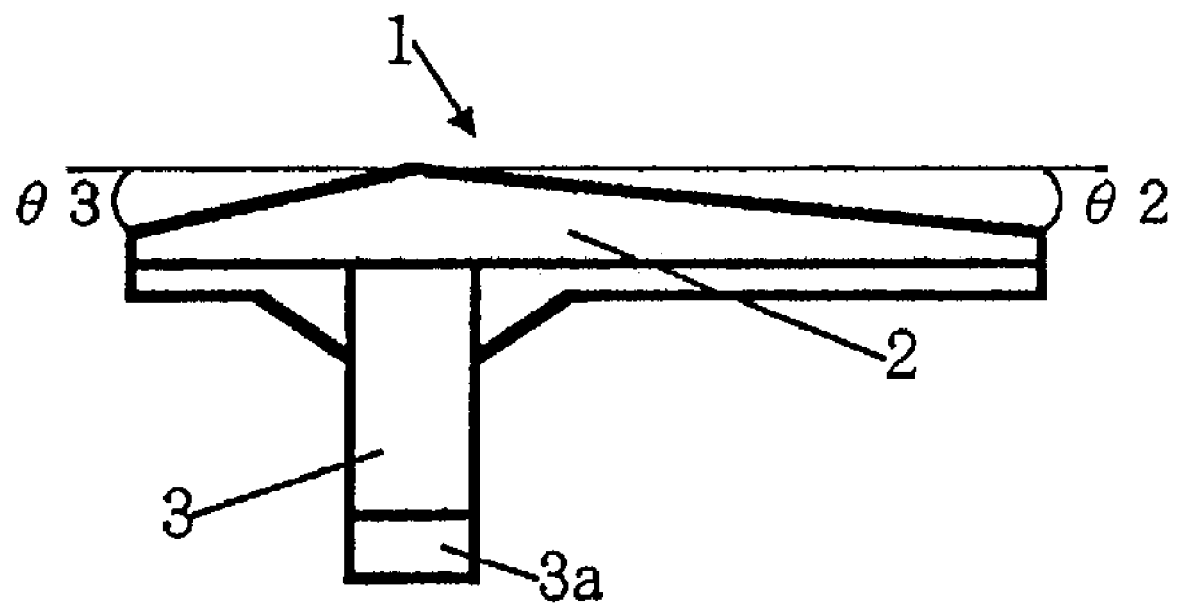

The preferred embodiment of the present invention is described below with reference to the drawings. FIG. 1 (A) is a sectional view of the drain structure of the electrical connection box according to the embodiment of the present invention, (B) is a sectional view of (A) taken along the line b-b, FIG. 2 (A) is a perspective view of the waterproof lid seen from above, (B) is a perspective view of the waterproof lid seen from below, (C) is a front view of the waterproof lid, and (D) is a side view of the waterproof lid.

Figure 3:
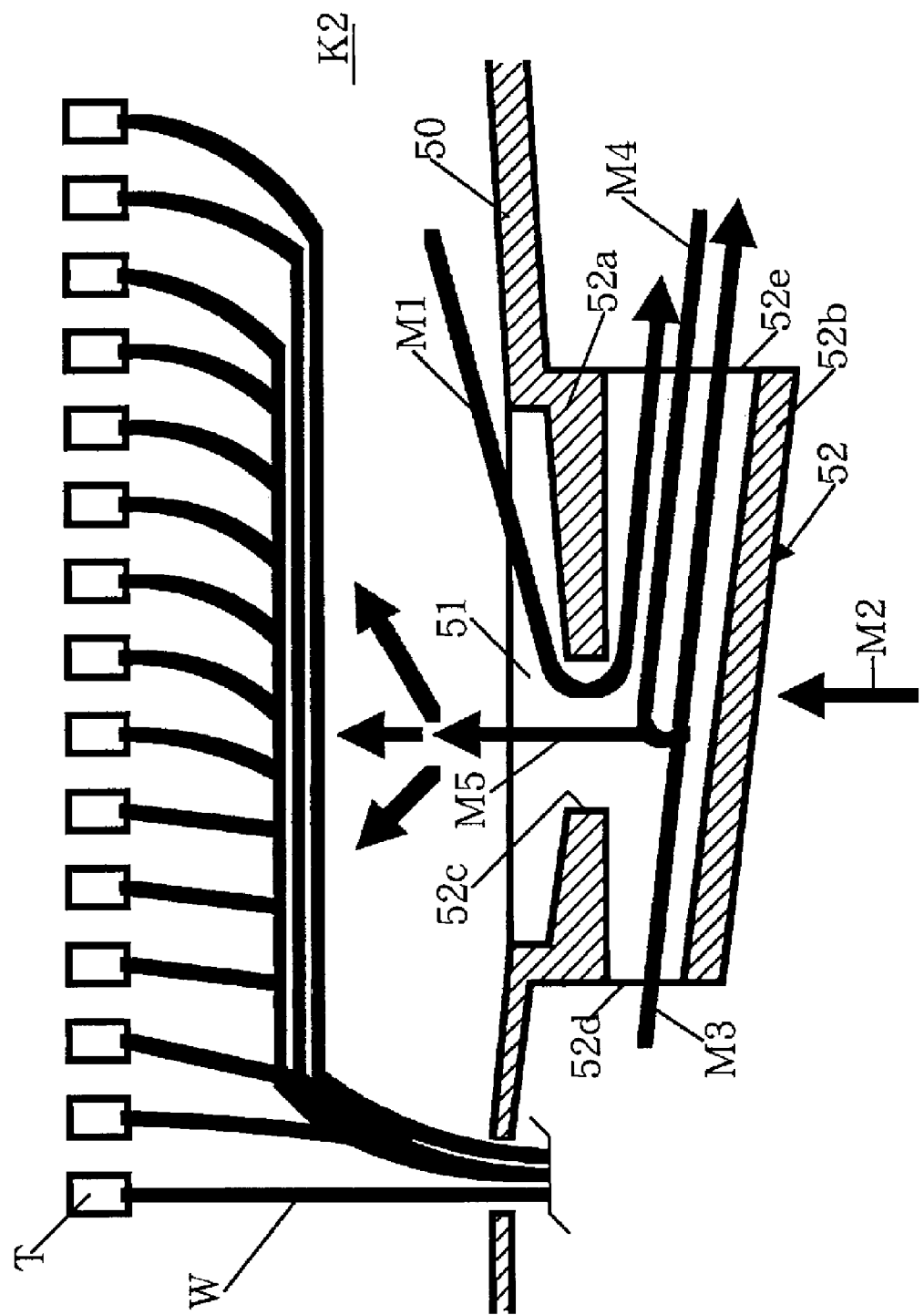
FIG. 3 is sectional view for explaining one prior art of drain structure of electric connection box.

As shown in FIG. 1, the drain structure of the electric connection box K1 according to the embodiment of the present invention is characterized in that the waterproof lid 1 is attached to the drain portion 52 as shown in FIG. 3.

The waterproof lid 1 includes a lid portion 2 which is substantially board-shaped, and a pair of engaging legs provided in the lower part of the lid portion 2.

The engaging hook 3a is formed on a pair of engaging leg portions 3a of the waterproof lid 1, and when the engaging hook 3a is engaged in the peripheral part of the communication hole 52c of the drain portion 52, the lid portion 2 is attached to cover the upper part of the water discharging hole 51.

The upper surface of the lid portion 2 of the waterproof lid 1 is formed to downwardly incline toward the outside. For example, an angle of θ1 in FIG. 2 (C) is 35 degrees, an angle of θ2 in FIG. 2 (D) is 4 degrees, and an angle of θ3 is 10 degrees. However, these angles are expressively provided as examples and the invention is not limited to the above value.

Since the upper surface of the lid portion 2 is formed to downwardly incline toward the outside as described above, the water flows toward the outside without being collected on the upper surface of lid portion 2, and can be easily drained off to the outside through the lower case or lower cover of the bottom wall 50, the water discharging hole 51, the communication hole 52c of the drain portion 52, and the drain port 52e (arrow M5 in FIG. 1 (B)). In the case that the waterproof lid 1 described above is provided inside the electric connection box, such a problem can be solved by the drain structure of the embodiment that when the electric connection box is downsized, the space of the inside is so insufficient that the wire harness and the waterproof lid 1 interfere with each other. More specifically, as described above, the upper surface of the lid portion 2 is formed to downwardly incline toward the outside. Thus, the contact area with the wire W such as wire harness or the like, which is arranged to run, is made large so that the stress to the wire harness W accompanied by the vibration of the vehicle body or the like can be reduced, and, accordingly, it is possible to prevent the wire W from breaking.

The pair of engaging leg portions 3 is configured to extend downward in the substantially vertical direction from the position which is located inner side of the peripheral part of the lid portion 2. Therefore, it is possible to prevent the wire W from interfering and winding around the engaging legs 3.

Furthermore, since the engaging legs 3 are formed to be wide in the horizontal direction of FIG. 1 (A) (in the vertical direction on the paper) and the water flows through the route shown with arrow in FIG. 1 (A), the water hits the engaging leg portions 3 and is surely dammed and prevented from penetrating through to the inside of the electric connection box.

According to the drain structure of electric connection box K1 in the embodiment of the present invention, the pair of engaging leg portions 3 of the waterproof lid 1 is engaged in the peripheral part of the communication hole 52c of the drain portion 52 and the lid portion 2 is provided to cover the upper part of the water discharging hole 51. Thus, the water which penetrates through to the inside of the electric connection box through the communication hole 52c and water discharging hole 51 of the drain portion 52, can be dammed with the use of the lid portion 2 of the waterproof lid 1 and can be prevented from gushing into the electric connection box (arrow M6 in FIG. 1(A)). As a result, it is possible to prevent the terminal portion T of the wire W such as wire harness or the like which is arranged to run from moistening with the water, and the penetration of water can be surely prevented.

Furthermore, since the waterproof lid 1 is separately formed from the lower case or lower cover, and is applicable as it is to the conventional structure (refer to FIG. 3), the structure becomes simple and extends wide design choice of the electric connection box.

The present invention is not limited to the embodiment described above, but can be variously changed within the scope of the technical feature described in the claims.

Industrial Applicability

The present invention is applied to various electric connection boxes incorporated in automobile or the like for draining off water which is inside the electric connection box and for preventing water from penetrating through from the outside.

What is claimed is:

1. A drain structure of an electrical connection box including a hollow drain portion in which a communication hole continuous with a water discharging hole of the electric connection box and a drain port for draining off water from said communication hole to outside are formed, and having a waterproof lid in the inside of said electrical connection box, said waterproof lid comprising:
   a lid portion which is substantially board-shaped; and
   a pair of engaging leg portions which is provided in a lower part of said lid portion,
   wherein said pair of engaging leg portions of said waterproof lid are engaged in a lower peripheral part of said communication hole of said drain portion, and said lid portion is attached to cover an upper part of said water discharging hole,
   wherein an upper surface of said lid portion of said waterproof lid is positioned under a wire in said electrical connection box and is formed to downwardly incline toward outside.

2. The drain structure of the electric connection box as claimed in claim 1, wherein said pair of engaging leg portions are formed to extend downward in substantially vertical direction from a position which is located inner side of a peripheral part of said lid portion.

3. The drain structure of the electric connection box as claimed in claim 2, wherein said pair of leg portions is formed to be wide in substantially horizontal direction.

4. The drain structure of the electric connection box as claimed in claim 1, wherein said pair of leg portions is formed to be wide in substantially horizontal direction.

\* \* \* \* \*